United States Patent [19]
Matick et al.

[11] Patent Number: 5,890,215
[45] Date of Patent: Mar. 30, 1999

[54] ELECTRONIC COMPUTER MEMORY SYSTEM HAVING MULTIPLE WIDTH, HIGH SPEED COMMUNICATION BUFFER

[75] Inventors: Richard E. Matick, Cortland; Stanley Everett Schuster, Granite Springs, both of N.Y.

[73] Assignee: International Business Machines Corporation, Armonk, N.Y.

[21] Appl. No.: 304,634

[22] Filed: Sep. 12, 1994

Related U.S. Application Data

[63] Continuation of Ser. No. 826,306, Jan. 24, 1992, abandoned.

[51] Int. Cl.$^6$ ................................................ G06F 12/00
[52] U.S. Cl. ............................................................ 711/133
[58] Field of Search ............................. 395/460; 711/133

[56] References Cited

U.S. PATENT DOCUMENTS

| | | | |
|---|---|---|---|
| 4,084,230 | 4/1978 | Matick | 364/200 |
| 4,489,381 | 12/1984 | Lavallee et al. | |
| 4,577,293 | 3/1986 | Matick et al. | 365/189 |
| 4,633,440 | 12/1986 | Pakulski | 365/189 |
| 4,823,259 | 4/1989 | Aichelmann et al. | 395/425 |
| 4,905,188 | 2/1990 | Chuang et al. | 364/900 |
| 4,912,630 | 3/1990 | Cochcroft, Jr. | 364/200 |
| 4,943,947 | 7/1990 | Kobayashi | 365/189.12 |
| 4,995,041 | 2/1991 | Hetherington et al. | 371/40.1 |
| 5,012,472 | 4/1991 | Arimoto et al. | 371/40.1 |
| 5,025,421 | 6/1991 | Cho | 365/230.05 |
| 5,121,360 | 6/1992 | West et al. | 365/230.03 |
| 5,226,009 | 7/1993 | Arimoto | 365/189.04 |
| 5,454,093 | 9/1995 | Abdulhafiz et al. | 395/460 |

FOREIGN PATENT DOCUMENTS

| | | |
|---|---|---|
| 0166192 | 1/1986 | European Pat. Off. |
| 0340668 | 4/1989 | European Pat. Off. |
| 0395559 | 3/1990 | European Pat. Off. |
| 2246001 | 1/1992 | United Kingdom |

OTHER PUBLICATIONS

Research Disclosure Feb. 1989 #298 "Cache Design which Eliminates Cache Store Miss Penalty" K. Mason Publications Ltd, England (Anon)

Asakura, M., et al. "An Experimental 1–Mbit Cashe DRAM with ECC." Journal of Solid–State Circuits, vol. 25, No. 1, Feb. 1990, pp. 5–10.

Chappell, T.I., et al. "A 2–ns Cycle, 3.8–ns Access 512–kb CMOS ECL SRAM with a Fully Pipelined Architecture." IEEE Journal of Solid–State Circuits, vol. 26, No. 11, Nov. 1991, pp. 1577–1585.

Hidaka, H., et al. "The Cache DRAM Architecture: A DRAM with an On–Chip Cashe Memory."IEEE Micro, Apr. 1990, pp. 14–25.

Kalter, H., et al. "A 50 ns 16MB DRAM with a 10ns Data Rate." 1990 ISSCC Digest of Technical Papers, pages 232, 233, and 303.

Matick, R.E., et al. "Architecture, design, and operating characteristics of a 12–ns CMOS functional cache chip." IBM Journal of Research and Development, vol. 33, No. 5, Sep. 1989, pp. 524–539.

*Primary Examiner*—David L. Robertson
*Attorney, Agent, or Firm*—Robert P. Tassinari, Jr.

[57] ABSTRACT

An electronic computer memory system has first and second intermediate memory levels for use between a central processing unit and a main memory level. One or more buffer arrays have two sets of bus lines. A first set of buffer array bus lines communicates with associated bus lines of the first and second intermediate memory arrays. The second set of buffer array bus lines contains a number of bus lines less than the number of bus lines in the first memory array. By providing one or more buffers with two sets of bus lines, data can be transferred between the main memory level and the buffer or one intermediate memory level while data in the other intermediate memory level is operated on by a the central processing unit. By providing the buffer with one set of bus lines equal to the number of bus lines of the first and second intermediate memory arrays, high speed data transfer between the intermediate memory arrays can be achieved.

16 Claims, 5 Drawing Sheets

ELECTRONIC COMPUTER MEMORY SYSTEM HAVING MULTIPLE WIDTH, HIGH SPEED COMMUNICATION BUFFER

This application is a continuation of application Ser. No. 07/826,306 filed Jan. 24, 1992 now abandoned.

BACKGROUND OF THE INVENTION

The invention relates to an electronic computer memory system having at least two intermediate memory levels between a central processing unit and a main or other memory level. In such a system, the intermediate memory levels generally increase in speed and unit cost, but decrease in size in direct relation to their proximity to the central processing unit. During program execution, data and instructions are exchanged between memory levels (a) to update memory levels farther from the central processing unit to reflect changes in data in memory levels closer to the central processing unit, and (b) to transfer data and instructions from memory levels farther from the central processing unit to memory levels closer to the central processing unit as necessary to continue the program execution.

The overall performance of an electronic computer memory system is related to the speed of each level of the memory hierarchy and to the time required for data to be transferred between the levels of the memory hierarchy when information required for program execution is not found in the memory level closest to the central processing unit. The time required to transfer data between memory levels is proportional to the amount of data to be transferred (for example, the cache line size), the access time of the memory level where the required data resides, and the width of the path between the memory levels in the hierarchy. Computer memory system performance also depends on the availability and number of ports between the memory levels, the processor, and the main memory, and the size of each memory level.

SUMMARY OF THE INVENTION

It is an object of the invention to provide an electronic computer memory system having first and second intermediate memory levels, a data transfer path from a main memory level to the first intermediate memory level which bypasses the second intermediate memory level, and a data transfer path from the main memory level to the second intermediate memory level which bypasses the first intermediate memory level.

It is another object of the invention to provide an electronic computer memory system in which a central processing unit can be operating on data in a first intermediate memory level concurrently with data transfer between a main memory level and a buffer or a second intermediate memory level.

It is another object of the invention to provide an electronic computer memory system having a wide, high speed data transfer path between the first and second intermediate memory levels.

An electronic computer memory system according to the present invention comprises a first memory array having a plurality of memory cells having a first access time. Each memory cell in the first memory array has an enable input and a bit line. The first memory array has a number of bus lines. Each bus line communicates with the bit lines of a plurality of first memory array cells.

The computer memory system further comprises a second memory array having a plurality of memory cells having a second access time slower than the first access time. Each memory cell in the second array has an enable input and a bit line. The second memory array has a number of bus lines. Each bus line communicates with the bit lines of a plurality of second memory array cells. The number of bus lines in the second memory array is at least equal to the number of bus lines in the first memory array.

The electronic computer memory system according to the present invention also includes a first buffer array having a plurality of memory cells. Each memory cell in the first buffer array has at least first and second enable inputs, and a bit line. The first buffer array has first and second sets of bus lines.

Each bus line in the first set communicates with the bit line of only one first buffer array cell. The first set of bus lines contains a number of bus lines equal to the number of bus lines in the first memory array. Each buffer array bus line in the first set communicates with an associated bus line of the first memory array and an associated bus line of the second memory array.

Each bus line in the second set of bus lines of the first buffer array communicates with the bit lines of a plurality of first buffer array cells. The second set of bus lines contains a number of bus lines less than the number of bus lines in the first memory array.

According to another aspect of the invention, the electronic computer memory system further comprises a second buffer array having a plurality of memory cells. Each memory cell in the second buffer array has at least first and second enable inputs, and a bit line. The second buffer array has first and second sets of bus lines. Each bus line in the first set communicates with the bit line of only one second buffer array cell. The first set contains a number of bus lines equal to the number of bus lines in the first memory array. Each second buffer array bus line in the first set communicates with an associated bus line of the first memory array and an associated bus line of the second memory array. Each bus line in the second set communicates with the bit lines of a plurality of second buffer array cells. The second set contains a number of bus lines less than the number of bus lines in the first memory array.

Preferably, the first and second memory arrays, and the first and second buffer arrays are formed in a single monolithic integrated circuit.

The first memory array may be, for example, a static random access memory.

The second memory array may be, for example, a dynamic random access memory. The second memory array may also include in error-correcting circuit to assure the integrity of the data transferred therefrom.

By providing an electronic computer memory system having at least one buffer array with two sets of bus lines, one of which communicate with first and second intermediate memory levels, a data transfer path from the main memory level to the first intermediate memory level can bypass the second intermediate memory level, and a data transfer path from the main memory level to the second intermediate memory level can bypass the first intermediate memory level.

By providing an electronic computer memory system having at least one buffer array with two sets of bus lines, data can be transferred between the central processing unit and a first intermediate memory level at the same time that data is transferred between the main memory level and the second intermediate memory level.

Further, by providing the buffer with a set of bus lines equal to the number of bus lines of the intermediate memory levels (that is, by providing wide data transfer paths between the buffer and the intermediate memory levels), high speed data transfer between the intermediate memory levels can be achieved.

DESCRIPTION OF THE PREFERRED EMBODIMENTS

Figure 1:
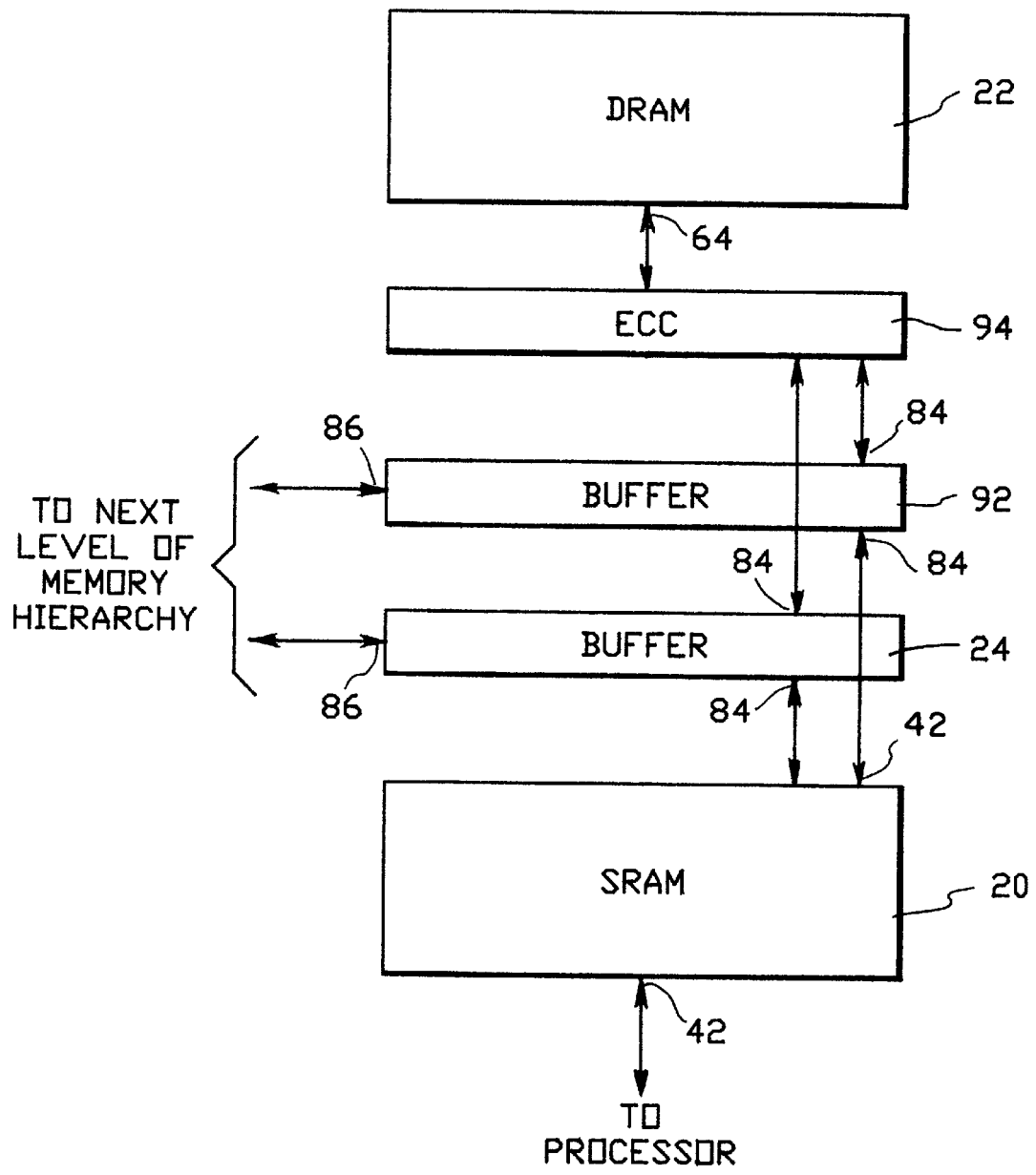
FIG. 1 is a block diagram of an example of an electronic computer memory system according to the present invention.

An example of an electronic computer memory system according to the present invention is shown in FIG. 1. The electronic computer memory system comprises a first memory array 20, a second memory array 22, and a first buffer array 24.

Figure 2:
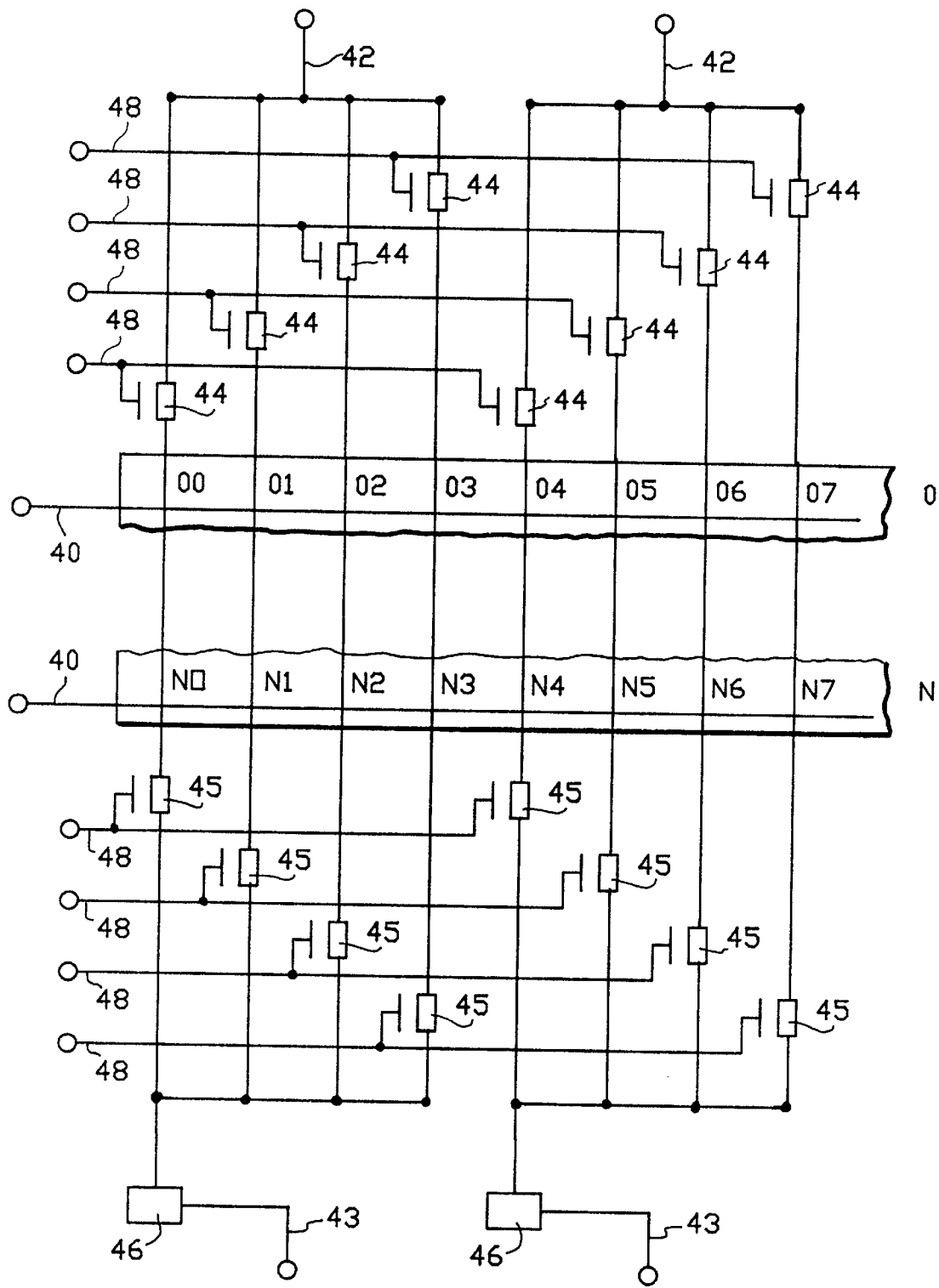
FIG. 2 schematically shows an example of a first memory array for an electronic computer memory system according to the present invention.

The first memory array 20 may be, for example, a static random access memory. FIG. 2 schematically shows an example of a portion of the first memory array. The first memory array comprises a plurality of memory cells. In FIG. 2, memory cells 0 through 7 on line 0, and 0 through 7 on line N are shown.

Figure 3:
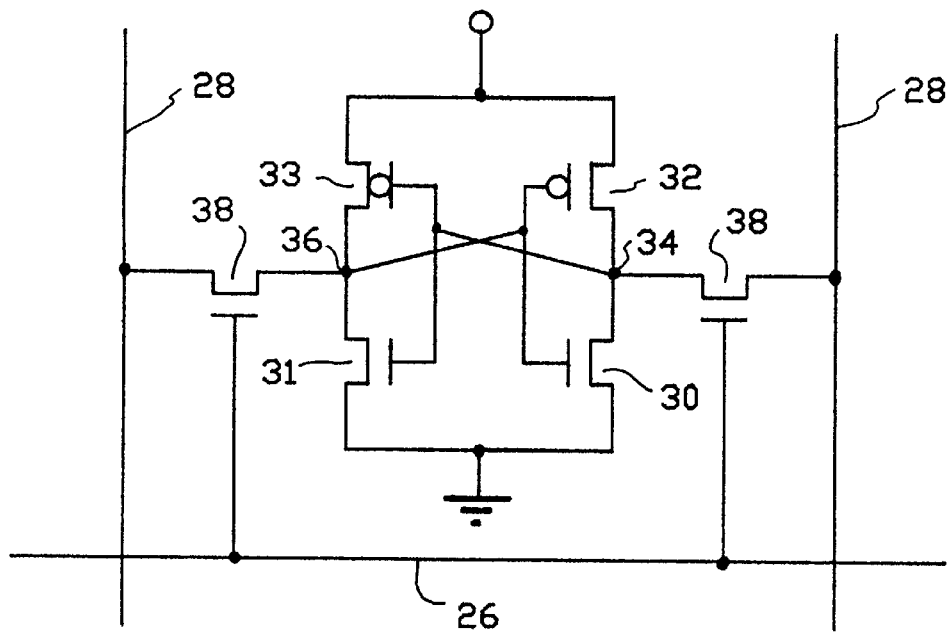
FIG. 3 schematically shows an example of a six-transistor memory cell for a static random access memory.

FIG. 3 schematically shows an example of a six-transistor memory cell for use in the memory array of FIG. 2. Each memory cell has an enable input 26, and a pair of bit lines 28 for both writing and reading data.

In this example, transistors 30 and 31 are n-channel enhancement type field effect transistors, while transistors 32 and 33 are p-channel enhancement type field effect transistors. When a high voltage is applied to the gates of transistors 30 and 32, transistor 30 will conduct while transistor 32 will not. When a low voltage is applied to the gates of transistors 30 and 32, transistor 32 will conduct while transistor 30 will not. Consequently, the memory cell will store data by latching either a high voltage at node 34 and a low voltage at node 36, or a low voltage at node 34, and a high voltage at node 36.

When a gate voltage applied to enable input 26 causes transistors 38 to conduct, data in the memory cell can be read out on lines 28. Alternatively, data can be written into the cell on lines 28.

Returning to FIG. 2, the enable inputs 26 of the memory cells of a line of the memory array are connected to a word line 40.

The first memory array has a number of bus lines 42 for writing data into the memory cells, and bus lines 43 for reading data from the memory cells. As shown in FIG. 2, the bus lines 42 and 43 terminate on opposite sides of the memory array. However, the bus lines can be extended so both communicate with a central processing unit on one side of the array 20, and with the remainder of the computer memory system on the other side. Each bus line may be either a single conductor, or may be a pair of conductors if memory cells such as shown in FIG. 3 are used.

Each bus line or bus line pair 42 and 43 communicates with the bit lines of a plurality of first memory array cells. In the example shown in FIG. 2, bus line 42 communicates with the bit lines by way of bit line switches 44 for writing data into the memory cells. Bus line 43 communicates with the bit lines by way of bit line switches 45 and sense amplifiers 46 for the purpose of reading data from the memory cells. The gate electrodes of bit line switches 44 and 45 are connected to bit selection lines 48 for selecting one or more memory cells on a given line of the memory array to which data will be written, or from which data will be read the bit line switches 44, as thus arranged, constitute a first decoder 100, and the bit line switches, as arranged, constitute a second decoder 102.

Returning to FIG. 1, the electronic computer memory system further includes a second memory array 22 which may be a dynamic random access memory. The second memory array 22 comprises a plurality of memory cells having a second access time slower than the access time of the first memory array 20. The number of memory cells in the second memory array 22 is greater than the number of memory cells in the first memory array 20. Typically, the second memory array 22 is less expensive than the first memory array 20, and the memory cells in the second memory array 22 are more densely packed than the memory cells in the first memory array 20.

Figure 4:
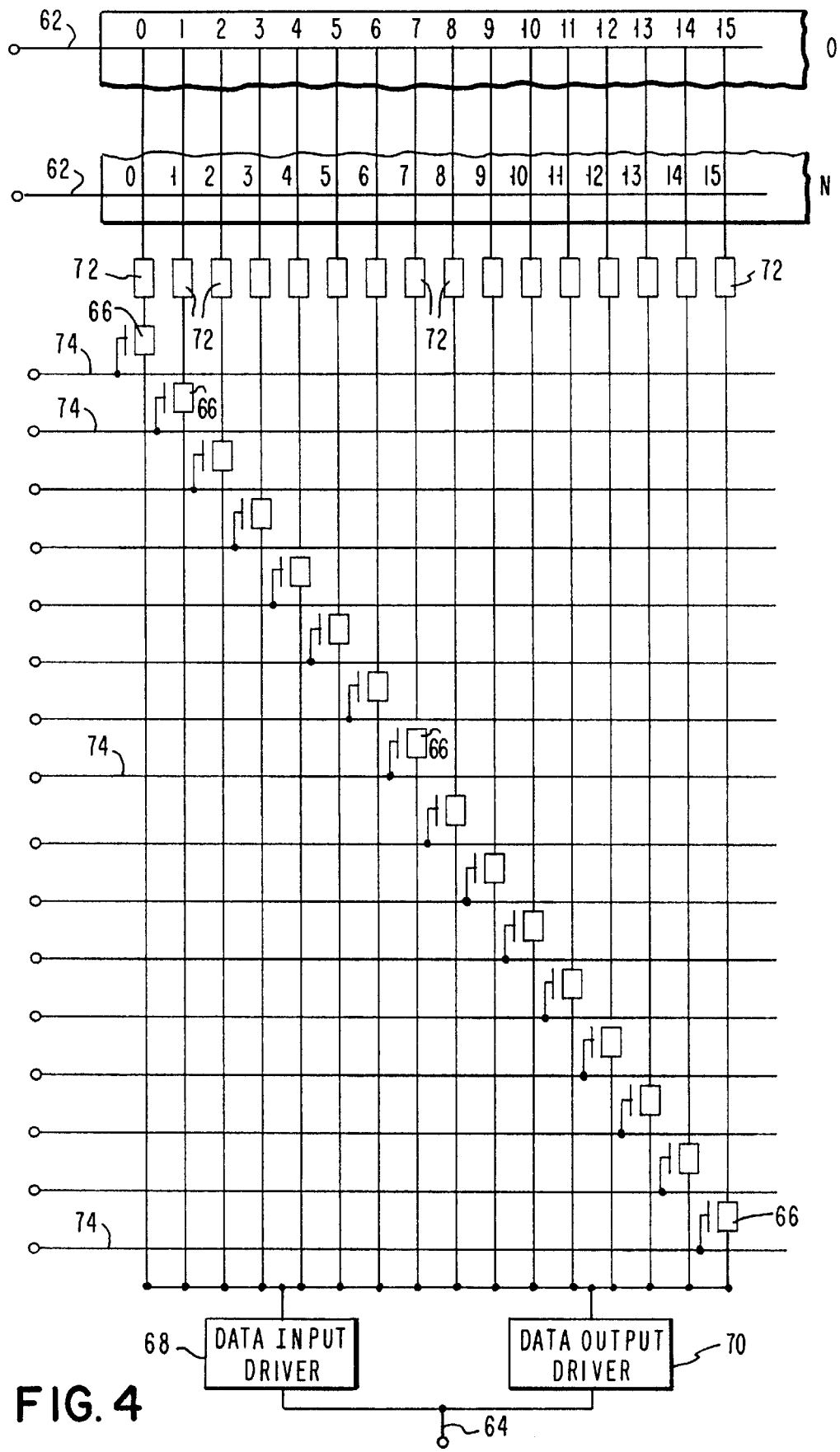
FIG. 4 schematically shows an example of a second memory array for an electronic computer memory system according to the present invention.

FIG. 4 schematically shows an example of a portion of a second memory array. Memory cells 0 through 15 of line 0, and memory cells 0 through 15 of line N of the second memory array 22 are shown.

Figure 5:
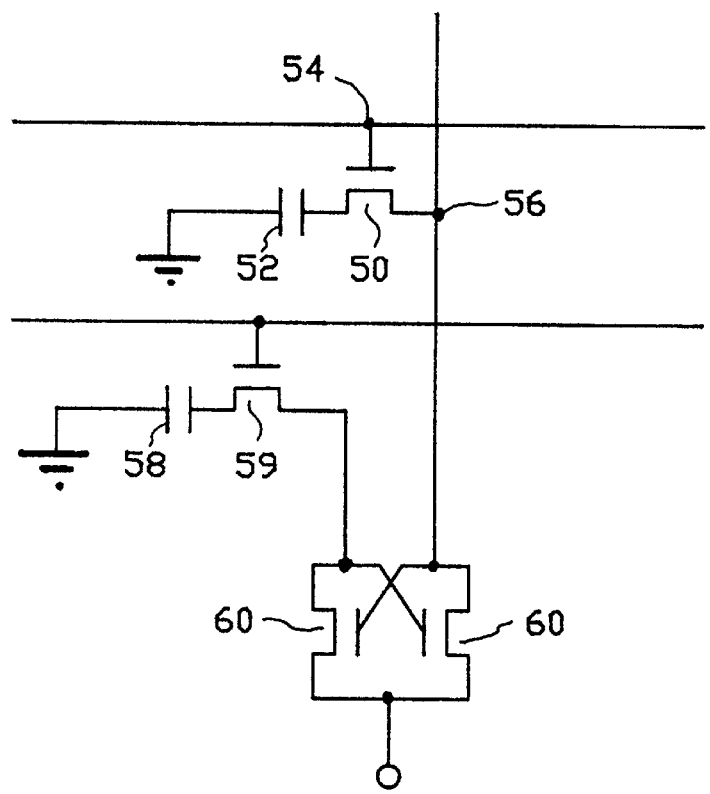
FIG. 5 schematically shows an example of a portion of a dynamic random access memory having a one-transistor memory cell.

An example of a portion of the dynamic random access memory of FIG. 4 is schematically shown in greater detail in FIG. 5. Each memory cell of the second memory array in this example includes a transistor 50 and a data capacitor 52. A memory cell stores data as either a high voltage across data capacitor 52, or a low voltage across data capacitor 52. When a suitable signal is applied to an enable input 54 of the memory cell, the bit line 56 communicates with the capacitor 52 so as to read data from the capacitor 52, or so as to write data into the capacitor 52. For the purpose of reading data from the capacitor 52, a reference charge is stored on a reference capacitor 58. When transistor switch 59 is closed, transistors 60 compare the reference charge on the reference capacitor 58 with the voltage read out of capacitor 52 to output a data signal onto a bus line.

Returning to FIG. 4, the enable inputs of the memory cells on a line of the memory array are connected to a word line 62. The second memory array 22 also has a number of bus lines 64, one of which is shown in FIG. 4. Each bus line communicates with the bit lines of a plurality of second memory array cells by way of bit line switches 66, and either data input driver 68 or data output driver 70, and interface circuits 72. Alternatively, there may be separate bus lines for the data input driver 68 and the data output driver 70. Interface circuits 72 contain, in part, sense amplifiers formed by the cross-coupled transistors 60 shown in FIG. 5.

The number of bus lines 64 in the second memory array 22 is at least equal to the number of bus lines in the first memory array 20. As further shown in FIG. 4, the gate electrodes of bit line switches 66 are connected to bit selection lines 74 for selecting one or more memory cells to which data will be written or from which data will be read.

Figure 6:
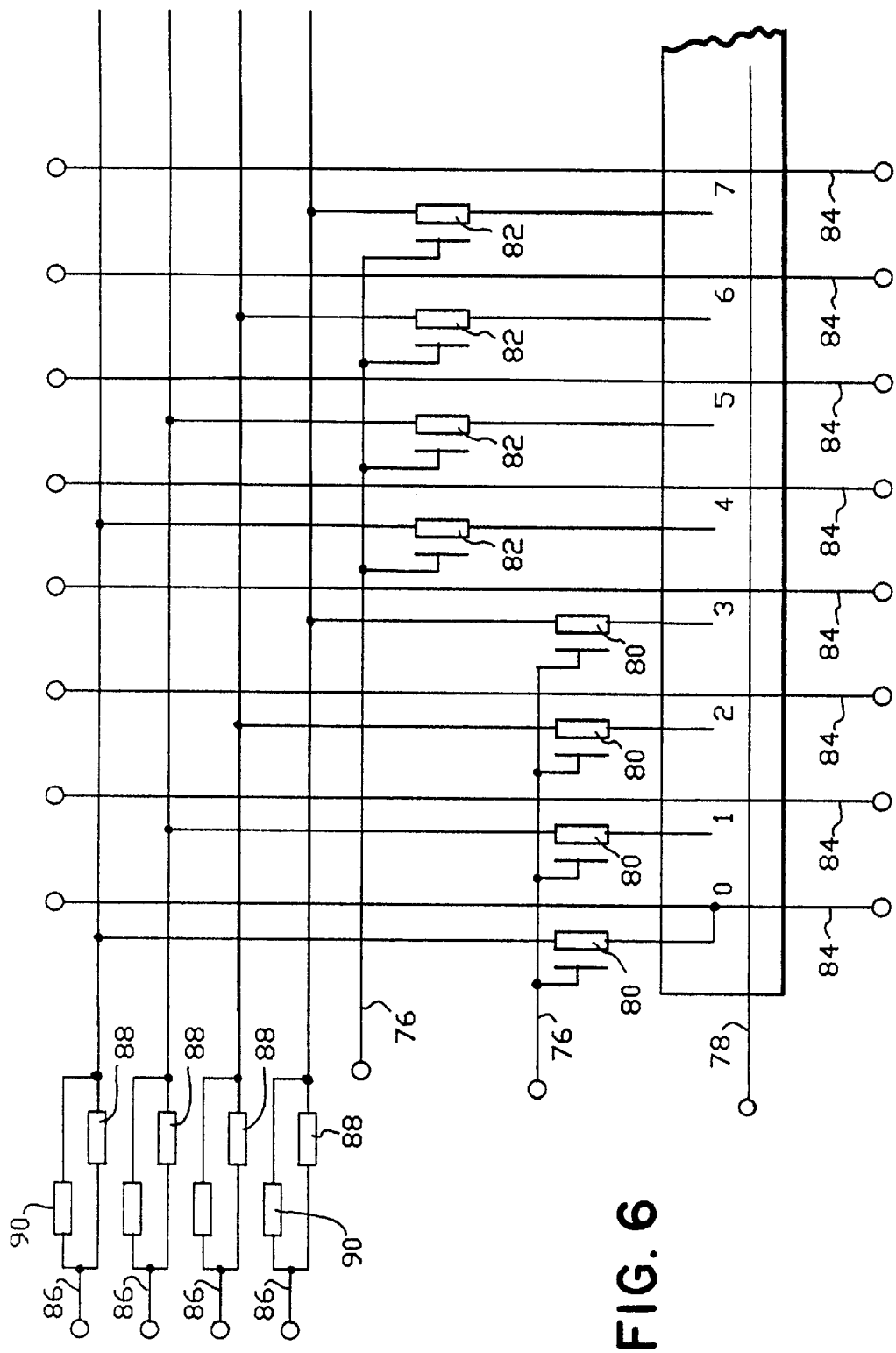
FIG. 6 schematically shows an example of a buffer array for an electronic computer memory system according to the present invention.

The electronic computer memory system according to the invention further includes a first buffer array 24 as shown in FIG. 1. An example of a portion of the first buffer array is schematically shown in more detail in FIG. 6. The first buffer array comprises a plurality of memory cells. Memory cells 0 through 7 are shown in FIG. 6. Each memory cell in the first buffer array 24 may, for example, be of the same type found in the first memory array as shown in FIG. 3.

Still referring to FIG. 6, each memory cell in the first buffer array has at least a first enable input 76 and a second enable input 78. By applying a suitable signal to one of the first enable inputs 76, either a first group of bit line switches 80 or a second group of bit line switches 82 select either memory cells 0 through 3, or memory cells 4 through 7. In comparison, by applying a suitable voltage to the second enable input 78, all of the memory cells of the first buffer array are selected.

Each memory cell of the first buffer array has, for example, a pair of bit lines 28 for writing data into the memory cell and for reading data from the memory cell, as shown in FIG. 3. The first buffer array 24 has a first set of bus lines 84 and a second set of bus lines 86. Each bus line 84 communicates with the bit line of only one first buffer array cell, as shown in FIG. 6. The first set of bus lines 84 contains a number of bus lines equal to the number of bus lines in the first memory array. Each first buffer array bus line 84 has terminals on both sides of the buffer array so that each bus line 84 can communicate with an associated bus line 42 of the first memory array 20 on one side of the buffer array, and can communicate with an associated bus line 64 of the second memory array 22 on the other side of the buffer array 24.

Each bus line 86 in the second set communicates with the bit lines of a plurality of first buffer array cells by means of the bit line switches 80 or 82, and by means of data input drivers 88 and data output drivers 90. The second set contains a number of bus lines 86 less than the number of bus lines in the first memory array.

Returning to FIG. 1, the electronic computer memory system preferably further includes a second buffer array 92 having a plurality of memory cells. Each memory cell in the second buffer array has at least first and second enable inputs, and a bit line. The second buffer array has a first set of bus lines, each communicating with the bit line of only one second buffer array cell. The first set contains a number of bus lines equal to the number of bus lines in the first memory array. Each second buffer array bus line in the first set communicates with an associated bus line of the first memory array and an associated bus line of the second memory array.

The second buffer array also has a second set of bus lines, each communicating with the bit lines of a plurality of second buffer array cells. The second set contains a number of bus lines less than the number of bus lines in the first memory array.

Preferably, the second buffer array has the same structure as the first buffer array, as shown in FIG. 6.

Preferably, the first and second memory arrays 20 and 22, and the first and second buffer arrays 24 and 92 are formed in a single monolithic integrated circuit (i.e., on a single chip). In this case, the bus lines 86 provide a connection from the monolithic integrated circuit to a main memory level which is not on the integrated circuit.

In order to assure the integrity of data transferred out of the dynamic random access memory 22, an error correction circuit (ECC) 94 may be provided as part of the second memory array. Error correcting circuit 94 may be any known and suitable design As discussed above, a central processing unit may be connected to the bus lines 42 on one side of the first memory array 20, as shown in FIGS. 1 and 2. In this case, the first memory array may be used, for example, as a four-way set associative cache with late select (See, for example, "Architecture, design, and operating characteristics of a 12-ns CMOS functional cache chip," by Richard Matick et al, *IBM Journal of Research and Development,* Volume 33, No. 5, September 1989, pages 524–539.) When the processor requires data or instruction which are contained in the first memory array 20, the required data is provided to the processor at the fast access speed of the first memory array 20.

In this example, when the processor requires data or instructions which are not contained in the first memory array 20, but which are contained in the second memory array 22, the operation of the processor is suspended while the required data is requested from the second memory array 22. The required data is first provided to one buffer 24 or 92 by way of the wide, high speed bus 84. Thereafter, the data is provided by the buffer to both the first memory array 20, and to the processor, after which the processor resumes operation.

When, in this example, the processor requires data or instructions which are not contained in either the first memory array 20 or the second memory array 22, the operation of the processor is suspended while the required data is requested from the next level of the memory hierarchy. Typically, the required data as well as other contiguous data is requested from the next level of the memory hierarchy.

By connecting the wide buses 84 of buffers 24 and 92 to the buses of both the first memory array 20 and the second memory array 22, the required data can be loaded into the buffer, loaded into the first memory array 20, and passed to the processor from the next level of the memory hierarchy without first loading the required data into the second memory array 22. Thereafter, while the processor operates on the required data, the buffer can be loaded through the narrow bus with the remaining nonrequired contiguous data. After the buffer is fully loaded, the data in the buffer can be copied to both the first memory level and the second memory level through the wide, high speed buses, while the operation of the processor is suspended for only a short time.

We claim:

1. An electronic computer memory system, comprising:
    a first multidimensional memory array having a first port and a second port;
    a second multidimensional memory array having a first port;
    a main memory array;
    a first bidirectional data transfer path connecting the main memory array and the first port of the first memory array, the first bidirectional data transfer path bypassing the second memory array;
    a second bidirectional data transfer path connecting the main memory array and the first port of the second memory array, the second bidirectional data transfer path bypassing the first memory array;
    a third bidirectional data transfer path connecting the second port of the first memory array and a processing unit;
    a wide, high speed bidirectional data path connecting the first port of the first memory array and the first port of the second memory array;

means for facilitating bidirectional data transfer between the main memory array and the second memory array simultaneously with data transfer between the first memory array and the processing unit;

wherein the first and second memory arrays and the wide, high speed data path reside in a single, monolithic integrated circuit chip.

2. The memory system of claim 1, wherein the first memory array includes a first decoder associated with the first port and a second decoder associated with the second port, the first decoder and second decoder allowing independent data writes and reads to and from the first and second ports of the first memory array.

3. The memory of claim 2, wherein:
the first memory array includes a plurality of rows of a first number of memory cells and a first access speed; and
the second memory array includes rows of a second plurality of memory cells and a second access speed slower than the first access speed.

4. The memory system of claim 2 wherein the wide, high speed data path connecting the first port of the first memory level and the first port of the second memory level comprises a first buffer array having an input/output port coupled to the first ports of the first and second memory arrays.

5. The memory system of claim 3, wherein the wide, high speed data path connecting the first port of the first memory level and the first port of the second memory level comprises a first buffer array having an input/output port coupled to the first ports of the first and second memory arrays.

6. The memory system of claim 5, wherein the second memory array further comprises an error correcting circuit connected to receive data from memory cells of the second memory array.

7. The memory system of claim 4, wherein the wide, high speed data path further comprises a second buffer array, having an input/output port coupled to the first ports of the first and second memory arrays.

8. The memory system of claim 7, wherein the first buffer array and the second buffer array each comprise a second port for receiving and transferring data to and from the main memory array, the first and second buffers thereby constituting independent branches of the first bidirectional data transfer path.

9. The memory system of claim 7, wherein the first memory array is a static random access memory.

10. The memory system of claim 7, wherein the second memory array is a dynamic random access memory.

11. The memory system of claim 7, wherein the input/output ports of the first and second buffer arrays each comprise a number of bus lines equal to the first number of memory cells.

12. The memory system of claim 11, wherein the second ports of the first and second buffer arrays each comprise a number of bus lines less than the first number of memory cells.

13. A system, comprising:
(a) a main memory having a number of cells;
(b) a single integrated circuit chip, comprising:
(i) a first multidimensional memory array having fewer cells than the main memory;
(ii) a second multidimensional memory array having more cells than the first memory array and a slower access speed and fewer cells than the main memory;
(iii) the first memory array having a first port for communicating with an off-chip processor and a second port for communicating with the second memory array via a wide, high speed, on-chip data path;
(iv) means for transferring data between the first memory array and the main memory while bypassing the second memory array, and between the second memory array and the main memory while bypassing the first memory array.

14. The system of claim 13, wherein the first memory array is an SRAM and the second memory array is a DRAM.

15. The system of claim 14, wherein the first memory array comprises a plurality of rows of a number, n, of memory cells, and wherein the wide, high-speed, on-chip data path comprises n lines.

16. The system of claim 15, wherein the wide, high speed, on-chip data path further comprises an on-chip first buffer array having a port with n data lines, the buffer array port being coupled to receive/transmit data from/to the first and second memory arrays.

* * * * *